United States Patent [19]

Condra et al.

[11] Patent Number: 5,304,252

[45] Date of Patent: Apr. 19, 1994

[54] METHOD OF REMOVING A PERMANENT PHOTOIMAGABLE FILM FROM A PRINTED CIRCUIT BOARD

[75] Inventors: Richard C. Condra, Highland Village; Paul C. Healey, Dallas; Michael R. Cochren, Garland; Eddie L. Wright, Ennis, all of Tex.

[73] Assignee: Oliver Sales Company, Dallas, Tex.

[21] Appl. No.: 936,789

[22] Filed: Aug. 28, 1992

Related U.S. Application Data

[63] Continuation of Ser. No. 334,374, Apr. 6, 1989, abandoned, and a continuation of Ser. No. 520,758, May 9, 1990, abandoned, and a continuation of Ser. No. 724,842, Jul. 2, 1991, abandoned.

[51] Int. Cl.$^5$ .............................................. B08B 3/08
[52] U.S. Cl. .......................................... 134/2; 134/29; 134/38
[58] Field of Search .................. 134/38, 2, 40, 29, 42, 134/26; 252/75, 135, 156, 158, 388, 389.3, 389.5, 389.54, 541, 542, 547, DIG. 8

[56] References Cited

U.S. PATENT DOCUMENTS

| | | | |
|---|---|---|---|
| 2,877,188 | 3/1959 | Liddell | 252/390 |
| 3,796,602 | 3/1974 | Briney et al. | 134/38 |
| 4,382,008 | 5/1983 | Boreland et al. | 252/75 |
| 4,428,871 | 1/1984 | Ward et al. | 134/38 |
| 4,592,787 | 6/1986 | Johnson | 134/38 |
| 4,686,059 | 8/1987 | Payerle | 252/75 |
| 4,770,713 | 9/1988 | Ward | 134/38 |

*Primary Examiner*—R. Bruce Breneman
*Assistant Examiner*—Saeed T. Chaudhry
*Attorney, Agent, or Firm*—Larry B. Dwight

[57] ABSTRACT

A method to remove permanent photoimagable solder mask simultaneously from the insulating laminate and conductive metal traces of a printed circuit board comprising the steps of heating a photoimagable solder mask removing solution comprised of an aqueous alkaline solution, an organic penetrating and softening agent and a tarnish and corrosion inhibitor, contacting the solution with the permanent photoimagable solder mask on the printed circuit board, allowing the permanent photoimagable solder mask to soften, and removing the photoimagable solder mask removing solution and softened permanent photoimagable solder mask simultaneously from the insulating laminate and conductive metal traces of the circuit board by rinsing the board with water.

12 Claims, 1 Drawing Sheet

METHOD OF REMOVING A PERMANENT PHOTOIMAGABLE FILM FROM A PRINTED CIRCUIT BOARD

CROSS REFERENCE TO RELATED APPLICATIONS

This application is continuation of Ser. No. 07/334,374 filed Apr. 6, 1989, 07/520,758 filed May 9, 1990 and 07/724,842 filed Jul. 2, 1991 entitled Method of Removing Photoimagable Solder Mask From a Printed Circuit Board now abandoned.

BACKGROUND OF THE INVENTION

(1) Field of the Invention

This invention relates to a method of simultaneously removing a cured, permanent photoimagable solder mask from printed circuit boards and the metal surfaces thereon.

(2) Background of the Invention

Printed circuit boards are often mass produced in the industry today. These boards generally comprise a reinforcement of fiberglass or other suitable material coated with an epoxy or other resin to form an insulating dielectric laminate. The laminate is laminated with electrically conductive materials such as copper for forming conductor traces later on. The laminate and conductor traces are then drilled to receive components and the metal (usually copper) on the board is then selectively etched to produce conductive traces over the board. A smooth surface rich in resin is exposed when the conductive material is etched away from the outer surface of the board. This smooth resin rich surface is called the "buttercoat". Prior to the components being stuffed or placed on a board, a permanent solder mask film is applied to the surface of the board and selected surfaces of the conductive metal traces to prevent solder from adhering to areas of the conductor traces where solder is not desired or from damaging the board during later processes. The permanent solder mask may be applied to the area to be protected either by screen printing the desired image in the desired location or by applying permanent photoimagable solder mask to the entire surface of the board and selected areas of the conductive metal traces and photoprinting the desired image onto the surface then developing the image.

This invention pertains to removal of cured permanent photoimagable solder masks from the insulating dielectric laminate and conductive traces simultaneously. The permanent photoimagable solder mask may be a liquid, a paste or ink type, or a dry film. The mask is selectively exposed through a stencil called a "phototool" by passing high intensity ultraviolet light through the phototool. This exposes the permanent photoimagable solder mask except for the opaque areas in the phototool. This exposure to high intensity ultraviolet light causes the areas exposed to the light to harden and become more chemically resistant. The board is then passed through a developer and the selected areas not exposed to the light are developed away leaving the pads of the conductor traces and drilled holes exposed for later processes. The remaining mask becomes permanently secured to the board over the insulating dielectric laminate and areas of the conductive metal traces.

The board is then cured by baking it in an oven. Upon being fully cured the board is then inspected for defects in the solder mask or for misregistration. If misregistration of the phototool occurs during the solder masking process, then the exposed areas of the board will not be properly aligned and the solder or tin would not adhere to the proper areas of the conductors during later processing. If left in this condition, the board would be unusable. Virtually all the materials and most of the labor required to manufacture the board have been expended by the time the board reaches the inspection process.

The solder mask of the type to be removed are those types for example manufactured by Dynachem, a division of Morton Thiokol, Inc. sold under the registered trademark "Laminar DM" dry film solder mask and under the trademark "Dynamask KM". Although the chemical composition of the solder mask is a trade secret, the literature represents that of the Dynamask KM utilizes epoxy chemistry. The chemical composition of these dry film solder masks is a negative resist type which is permanent in nature and referred to in the industry as "permanent".

These are different from temporary photo-polymers used in the etching processes such as those of the Celeste type described in U.S. Pat. No. 3,469,982 to Celeste; No. 4,064,287 to Lipson et al; No. 4,592,787 to Johnson et al; No. 4,776,892 to Steppan; or the types such as the silicone or polyvinyl cinnamates described in U.S. Pat. Nos. 3,673,099 to Corby et al; No. 4,744,834 to Hag; No. 4,428,871 to Ward et al; or No. 4,770,713 to Ward. The masks described in the above patents are developed such that they cover only selected areas of the conductive metal. The metal is etched away exposing the insulating laminate and the remaining mask is adhering to the remaining traces only. The photoimagable films described in these patents are materials which are easily removed from the conductive metal traces by solvents and mechanical actions such as rubbing, brushing or abrading as described in the patents.

The solder mask which is permanently affixed to the board over the insulating laminate and conductive metal is described by the literature of the manufacture as resistant to most aqueous and solvent defluxing medias and other known methods of removal. It is these films that are sought to be removed from the insulating laminate and conductive metal traces simultaneously by the method described herein.

To make the board which is misregistered usable, the solder mask would have to be stripped from the surface of the board and the solder masking process repeated.

Besides misalignment or misregistration of the phototool in the exposure of the permanent photoimagable solder mask, processing defects such as blistering or other evidence of poor adhesion may occur requiring the stripping of the permanent photoimagable solder mask.

In the past, several methods to remove solder mask have been used with only varying degrees of success. One method used a strong organic solvent such as methylene chloride or other chlorinated solvents often mixed with aldehydes or ketones such as acetone. This solution used at room temperature required a relatively long soak or exposure time of over 8 hours to remove the solder mask. This led to the solution attacking the underlying surface of the laminate and exposing the reinforcement or fiberglass because the solvent would dissolve part of the buttercoat. Even the bond between the connector traces and the laminate might be weakened reducing the structural integrity of the board.

Exposing the reinforcement can result in water absorption from the atmosphere which can lead to shorting of the components. Often boards which have had solder mask removed in this matter will not meet industry and military specifications because of the roughened surface and exposed reinforcing weave. Further this method requires vigorous mechanical scrubbing which tends to break down the surface and expose the connectors to mechanical damage. These solutions are inherently toxic and cause environmental problems in their disposal.

Another method used in the past, utilized a strong alkali such as sodium hydroxide or potassium hydroxide mixed with lower alcohols. This solution used at room temperature causes the coating to swell and release from the substrate. However, the alcohols are extremely flammable and produce a hazardous material which is difficult to dispose of properly. Further this method typically takes eight (8) or more hours to remove permanent photoimagable solder mask and it generally comes off in large pieces which may adhere to an adjacent board making cleanup of the board more difficult Lower alcohol mixtures used to remove solder mask may also contain amines such as ethylene diamine or ethanolamine. Amines are very toxic and interfere in the waste treatment of metal ions such as copper, etc. also found in industrial waste water.

Another method utilized in the past uses a rather low concentration of strong alkali mixed in water and mixed with a high concentration of glycol ethers such as ethylene glycol butyl ether or diethylene glycol butyl ether. Typically, the alkali concentration is less than five (5) percent by weight, the water concentration is typically less than fifteen (15) percent by weight and most of the balance of the remover is glycol ethers. The higher concentration of glycol ethers may attack the buttercoat of the laminate. This solution typically used at room temperatures generally takes eight (8) or more hours to operate. The permanent photoimagable solder mask comes off in large pieces which is inconvenient and difficult to clean up.

Both the methods described above using alkali removers work on the solder mask from the edge of the board as the solution works its way under the surface of the permanent photoimagable solder mask. In addition, the remover breaks the bond of the permanent photoimagable solder mask over the conductive traces first. Then the remover works from the edge of the board and the edges of the conductive traces inwardly Thus, the conductive traces are exposed for a longer period of time possibly weakening the bond of the conductor to the board. As the remover works inward from the conductive traces and the edge of the board, some areas of the buttercoat are exposed to the remover. The exposed areas of the buttercoat are attacked as they are exposed and these portions of the buttercoat may be damaged. The alkalis tend to attack and tarnish the copper of the conductor traces or subject it to rapid oxidation once it is removed from the bath.

All of the above methods permit the permanent photoimagable solder mask to come off in large pieces which then float in the remover and often times adhere to an adjacent board making cleanup of the board more difficult.

None of these methods work well on solvent processable permanent photoimagable solder mask.

Another method sometimes used is known as the abrasive blast method which is similar to sand blasting wherein abrasive particles are sprayed under high pressure onto the surface of the board to remove the solder mask. The blasting of the solder mask results in a loss of or damage to the buttercoat and abrasion to the conductors.

SUMMARY OF THE INVENTION

The invention comprises a method of utilizing an aqueous alkaline solution to bathe the circuit board and which will soften and dissolve from the insulating laminate and conductive traces a permanent photoimagable solder mask film into the solution or into subsequent water rinses rather than being removed from the surface in large pieces This makes subsequent cleaning of the board much easier. Removal of the permanent photoimagable solder mask generally occurs within one-half ($\frac{1}{2}$) to one and one-half (1 $\frac{1}{2}$) hours rather than the 8 hours or more required by previous methods. This method permits the removal of a permanent photoimagable solder mask film from the board without excessive soak time, without tarnishing or corroding of the conductors, and without attacking the buttercoat of the laminate. This method permits the rapid cleanup of the board without leftover residues.

The primary object of the invention is to provide a method of removing permanent, photoimagable solder mask from printed circuit boards laminate and conductive traces simultaneously that does not deteriorate or attack the underlying structure of the board or the conductor traces located thereon.

A further object of the invention is to provide a method of removing permanent photoimagable solder mask which reduces the harm to the environment upon disposing of the waste solution and to those using the solution.

A still further object of the invention is to produce a method of rapidly removing a permanent photoimagable solder mask which have already been cured simultaneously from the laminate and conductive traces.

A still further object of the invention is to provide a method of removing a permanent photoimagable solder mask which has been cured to allow the boards to be usable.

Other and further objects of the invention will become apparent upon reading the detailed description of the invention which follows.

DESCRIPTION OF THE DRAWINGS

Drawings of the invention and a typical printed circuit board are annexed hereto so that the invention may be better and more fully understood, in which.

Numeral references are employed to designate like parts throughout the various figures of the drawings.

DETAILED DESCRIPTION OF INVENTION

Figure 1:
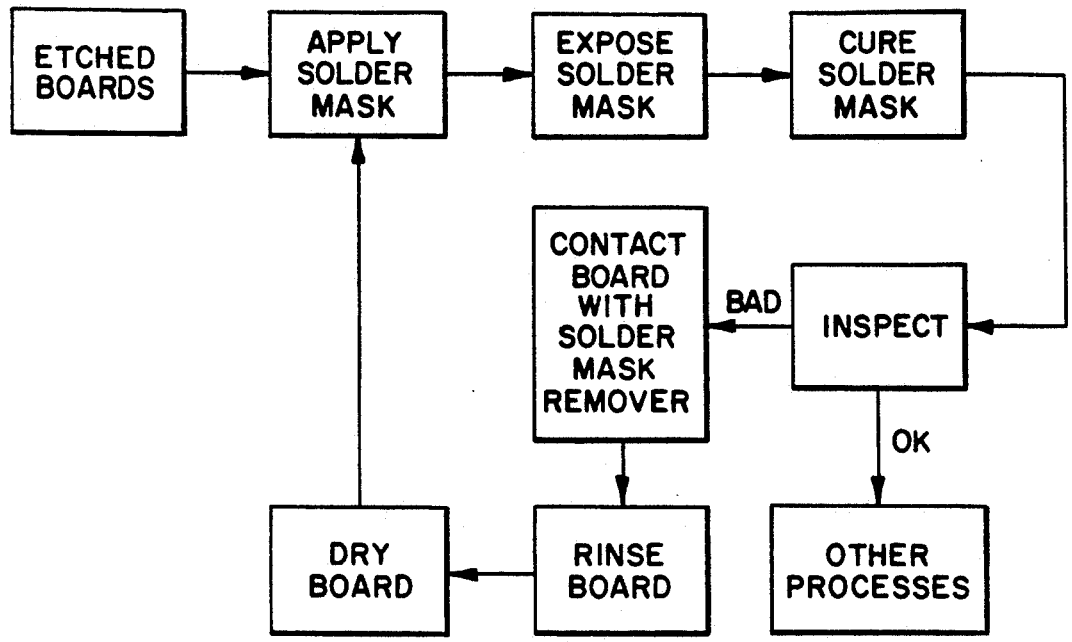
FIG. 1 is a block diagram of the steps of the process.

As previously set forth in the summary of invention this invention involves the removal of a thin layer of what is known in industry as permanent photoimagable solder mask 1 from a laminated circuit board 2 which is composed of epoxy or other resin. The circuit board 2 is comprised of the insulating dielectric laminate and a conductive metal. The permanent photoimagable solder mask is of the type, for example, as those manufactured by Dynachem, a division of Morton Thickol, Inc. under the trademark "Dynamask KM" dry film solder mask and registered trademark "Laminar DM" dry film solder mask which are permanent, photoimagable films which are secured to the surface of the insulating laminate and conductive traces of the printed circuit board and resistant to aqueous and solvent fluxing and defluxing agent and is chemically and thermally resistant to these solutions as well. The manufacture's literature on the permanent photoimagable solder mask represents that the cured film is totally resistant to aqueous, alkaline and solvent solutions which may be applied to the film after its being cured. In fact, the industry has found this to be true. Although the chemical composition of the solder mask is a trade secret, the literature represents that of the Dynamask KM is an epoxy acrylic copolymer. The chemical composition of these dry film solder masks is a negative resist type which is referred to in the industry as "permanent".

These are different from temporary photo-polymers used in the etching processes such as those of the Celeste type described in U.S Pat. No. 3,469,982 to Celeste; No. 4,064,287 to Lipson et al; No. 4,592,787 to Johnson et al; No. 4,776,892 to Steppan; or the types such as the silicone or polyvinyl cinnamates described in U.S. Pat. Nos. 3,673,099 to Corby et al; No. 4,744,834 to Hag; No. 4,428,871 to Ward et al; or No. 4,770,713 to Ward. The photoimagable films described in these patents are materials after being developed and cured only cover the selected areas of metal prior to etching and which are easily removed from the metal by solvents and mechanical actions such as rubbing, brushing or abrading as described in the patents. The solder mask which is permanently affixed to the board over insulating laminate and selected areas of the conductive traces is described by the literature of the manufacture as resistant to most aqueous and solvent defluxing medias and other known methods of removal. It is these films that are sought to be removed by the method described herein. As herein before described, the permanent photoimagable dry film solder mask adheres to both the insulating laminate and conductive metal traces and differs from the temporary films which are meant to be stripped in that the temporary films have to be removed from metal surfaces only and adherence is less on these surfaces.

As heretofore described, experience has shown that a low concentration of an aqueous alkaline solution produces negligible results and only over a long period of time. Experience has shown that heating the solution does not appreciably reduce the time required to strip a board. It is only when using a high concentrate of the aqueous alkaline solution combined with heating the solution to the hereinafter described temperatures that unexpectedly that the results described herein were achieved. One would not expect that by merely increasing the concentration and the temperature that the results would change but the two in fact produce a synergistic result.

Figure 2:
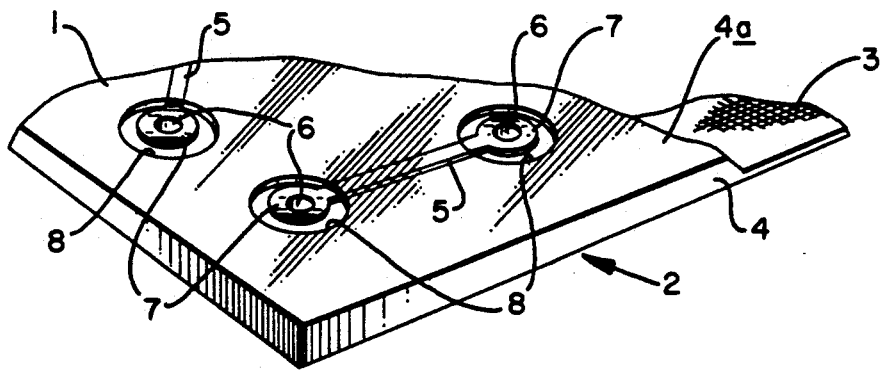
FIG. 2 is a pictorial upper view of a circuit board showing prope alignment of the solder mask.
Figure 3:
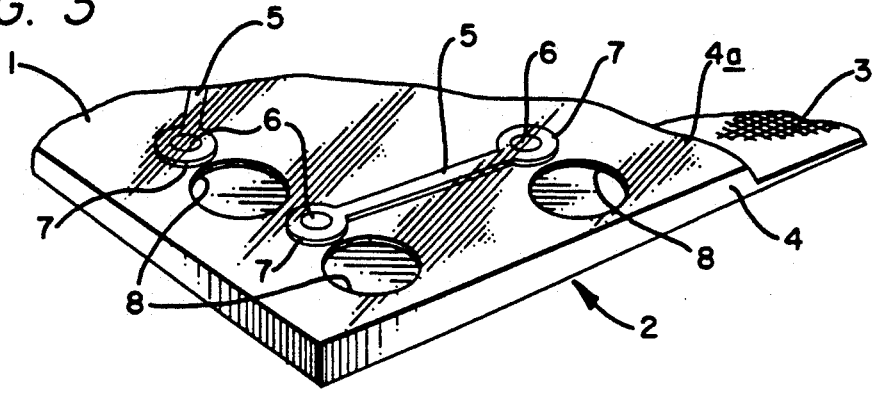
FIG. 3 is a pictorial upper view of the same board showing misregistration of the solder mask.

The board, as shown in FIG. 2, has a reinforcement which is typically fiberglass 3 surrounded by resin 4 to form the insulating dielectric laminate. The etching process used to form the conductive traces 5 on the board exposes the smooth buttercoat on surface 4a exposed on which is left the conductive traces 5. Along the traces 5 where components will later be attached, holes 6 are drilled. Pads 7 ar typically formed around the holes 6 during the etching process. Openings 8 are formed in the permanent photoimagable solder mask 1 which permit these pads 7 to be exposed to solder in later processes. Over the remainder of the board including both the laminate and conductive traces the permanent photoimagable solder mask 1 prevents the solder from adhering to the conductive traces 5 except where exposed. FIG. 3 illustrates the problem of misregistration wherein the openings 8 in the permanent photoimagable solder mask 1 are shifted away from the pads 7 and the permanent photoimagable solder mask covers the pads 7 thereby making the board unusable.

The basic steps of the method are: heating a photoimagable solder mask removing solution as described more fully hereinafter, contacting the solution with the permanent photoimagable solder mask on the printed circuit board, allowing the permanent photoimagable solder mask to soften simultaneously from the laminate and conductive metal traces, and removing the permanent photoimagable solder mask removing solution and softened permanent photoimagable solder mask from the laminate and traces by rinsing the board with water.

The photoimagable solder mask removing solution used in this method contains a fully dissolved aqueous alkaline solution of an activator such as a hydroxide or a silicate and may also contain an organic penetrating and softening agent and a tarnish and corrosion inhibitor selected from the groups as hereinafter disclosed. The operable portion of the photoimagable solder mask removing solution contains chemical compounds which are in solution as opposed to any excess which may be in emulsion or suspension. The photoimagable solder mask removing solution is placed in a dip tank such as a stainless steel or mild steel tank and heated to a temperature between about 140 and 210 degrees Fahrenheit with the most preferred temperature being about 180 degrees Fahrenheit. The circuit board or boards are immersed within the photoimagable solder mask removing solution allowing contact with the permanent photoimagable solder mask simultaneously over the laminate and conductive traces for a period of between thirty (30) and sixty (60) minutes or until the permanent photoimagable solder mask film is softened and/or swells into a jelly-like mass over the laminate and conductive traces.

Agitating the photoimagable solder mask removing solution by mechanical means will reduce the reaction time for removal of the permanent photoimagable solder mask simultaneously from the insulating laminate and conductive traces. The circuit board is removed from the tank and the remaining permanent photoimagable solder mask removing solution and the softened permanent photoimagable solder mask are removed simultaneously from the laminate and conductive traces. The board may be scrubbed or brushed, then rinsed with fresh water, preferably a spray, which removes the solution and permanent photoimagable solder mask simultaneously from the insulating laminate and conductive traces. And then the board is dried. Brushing may be minimized or eliminated by placing the board in a water soak rinse for about five (5) minutes prior to the spray rinsing. This causes the most of the softened permanent photoimagable solder mask to go into solution in the rinse water. The water rinse may be at room temperature but use of water warmed to about 100 degrees Fahrenheit or higher is preferred. Agitating the parts in the rinse water speeds the removal of the softened permanent photoimagable solder mask.

The soak time of the boards in the above-referenced method is for use on aqueous processable permanent photoimagable solder masks. For solvent processable permanent photoimagable solder masks soak times of the boards in the solution will need to be increased to between four (4) and eight (8) hours.

The aqueous alkaline solution is an alkali mixed in water which penetrates and softens the permanent photoimagable solder mask and usually causes it to swell simultaneously on the laminate and conductive traces. The alkali causes the permanent photoimagable solder mask to become substantially water soluble such that cleanup may be done with water which does not harm the board.

The activator in the aqueous alkaline solution can be chosen from one or more of the chemical compounds of the following group comprised of alkali metal hydroxides such as sodium and potassium hydroxide, alkali metal silicates such as sodium metasilicate, and/or quaternary ammonium hydroxides such as tetramethyl ammonium hydroxide. The concentration of the activator in the aqueous solution is from five (5) parts per hundred to forty (40) parts per hundred by weight with the preferred concentration being between ten (10) parts per hundred and twenty (20) parts per hundred by weight.

The organic penetrating and softening agent is preferably added to the aqueous alkaline solution of the photoimagable solder mask removing solution to speed up the process. The reaction time of the softening process is reduced and the permanent photoimagable solder mask becomes softer and is removed more easily.

The penetrating and softening agent may be selected from a group of organic chemicals that include but are not limited to pyrrolidones such as: 2-pyrrolidone, alkyl substituted 2-pyrrolidone, N-alkyl substituted 2-pyrrolidone, N-alkyl substituted alkyl substituted 2-pyrrolidone; a group of lower molecular weight amides such as: formamide, N-alkyl substituted formamide, acetamide, N-alkyl substituted acetamides, and other lower molecular weight amides and N-alkyl substituted amides; or a group of glycol ethers of lower molecular weight alcohols such as: methyl, ethyl, propyl, butyl, or phenyl ethers of ethylene glycol, diethylene glycol, triethylene glycol, propylene glycol, dipropylene glycol, or tripropylene glycol. The concentration of the penetrating and softening agent in the photoimagable solder mask removing solution is from zero (0) parts per hundred to forty (40) parts per hundred by weight in order to form a homogeneous solution. The preferred concentration of the penetrating and softening agent is up to fifteen (15) parts per hundred by weight depending on the solubility of the chosen organic penetrating and softening agent in the aqueous alkaline solution and depending further on the activator chosen and the concentration thereof.

The organic penetrating and softening agents have limited solubility in the aqueous alkaline solution. Quantities of the penetrating and softening agent added to the aqueous alkaline solution in excess of its maximum soluble concentration separate from the aqueous solution giving a milky appearance or forming an insoluble liquid layer. An organic penetrating and softening agent added to the aqueous alkaline solution in quantities greater than its maximum solubility in the aqueous alkaline solution is not usually detrimental to the performance of the solder mask removing solution, but is of little or no value in improving performance. Since the excess penetrating and softening agent contributes to the cost of the photoimagable solder mask removing solution with little or no increase in performance, the preferred concentration is at or below its maximum soluble concentration in the aqueous alkaline solution.

The solder mask removing solution may also contain a corrosion inhibitor and tarnish retarding compound to protect the conductive traces 5 including but not limited to: sodium or potassium silicate, sodium or potassium chromate, sodium or potassium tungstate, sodium or potassium vanadate, mercapto-benzothiazole, benzotriazole or sodium salt of benzotriazole, tolyltriazole or sodium salt of totyltriazole, alkyl substituted imidazoles, or alkyl substituted imidazolines in a concentration of approximately 0.001 to about 5.0 parts per hundred by weight. The preferred concentration in the aqueous alkaline solution is between 0.1 and 1.0 parts per hundred by weight. The corrosion inhibitor and tarnish preventing compound tends to reduce any corrosive effects, if any, the solder mask removing solution would have on the conducting traces of the printed circuit board. This solder mask removing solution provides a nonflammable solution for removing the permanent photoimagable solder mask which is safer to the environment and the persons utilizing the solution than those methods which have been previously used. Further, the chemicals involved in this solution do not interfere with the cleanup of wastewaters from industrial plants utilizing chemicals in the processing of printed circuit boards. Thus, the impact on the environment is minimized in the selection of these chemicals.

After the permanent photoimagable solder mask is removed and the circuit board is dried then it may be processed through the normal procedures to reapply the permanent photoimagable solder mask in a correct manner.

The heating of the solder mask removing solution may be accomplished with standard heaters available in the industry such as stainless steel, mild steel, titanium and teflon heaters which are compatible with the solution.

There are numerous means to provide agitation to the aqueous alkaline solution available in the industry such as mechanical shakers which attach to the board or tank, or vibrating and/or stirring devices placed within the solution as heretofore described which decrease the soak time in the solution.

Another method of applying the solder mask removing solution to the permanent photoimagable solder mask on the board is by spraying the permanent photoimagable solder mask with the solution. This decreases the exposure time of the boards to remove the permanent photoimagable solder mask.

Commercial spray washer units with spray nozzles to spray the hot photoimagable solder mask remover solution onto the permanent photoimagable solder mask of the boards until the permanent photoimagable solder mask is softened and swelled may be employed. The boards are then rinsed with water. Spray rinsing or dip rinsing followed by spray rinsing may be used.

Once the boards are rinsed then they are dried by methods used int the industry such as hot air blown across the surface of the board or mechanical means such as utilizing absorbent material to absorb the water off of the surface. This prevents water spots on the boards which are distracting to the appearance of the printed circuit board.

Some examples of preferred photoimagable solder mask removing solutions are shown as follows but are not limited thereto:

| | | |
|---|---|---|
| 1. | Sodium hydroxide | 10% |
| | Propylene glycol monopropyl ether | 10% |
| | Tolyltriazole, sodium salt | 0.04% |
| | Water | Balance |
| 2. | Potassium hydroxide | 15% |
| | N methyl, 2-pyrrolidone | 5% |
| | Benzotriazole | 0.03% |
| | Water | Balance |
| 3. | Tetramethyl ammonium hydroxide | 25% |
| | Mercapto-benzothiazole | 0.1% |
| | Water | Balance |
| 4. | Sodium metasilicate | 20% |
| | Water | Balance |

Many modifications and variations of this invention may be made without departing from its spirit the scope, as will become apparent to those skilled in the art. The specific embodiments described herein are offered by way of example only and the invention is limited only by the terms of the intended claims.

We claim:

1. A method for removing a epoxy acrylic copolymer photoimagable solder mask of a negative resist simultaneously from the insulating laminate and conductive metal braces of a printed circuit board comprising the steps of:
    (a) contacting the permanent photoimagable solder mask on the insulating laminate and conductive metal traces of the printed circuit board with solder mask removing solution containing water and an activator compound chosen from a group consisting of a hydroxide or alkali metal silicate and of a concentration greater than twelve pars per hundred by weight;
    (b) heating the solder mask removing solution to a temperature between 140 and 210 degrees Fahrenheit;
    (c) allowing the solder mask removing solution to continue contact with the permanent photoimagable solder mask for a period of time of one hour to soften the permanent photoimagable solder mask; and
    (d) removing the solder mask removing solution and softened permanent photoimagable solder mask from the laminate and conductive metal traces on the circuit board.

2. The method called or in claim 1 wherein the hydroxide is chosen from a group comprised of alkali metal hydroxides, or quaternary ammonium hydroxide.

3. The method called for in claim 1 wherein the aqueous solution contains a corrosion inhibiting and tarnish retarding compound of between 0.001 to 5.0 parts per hundred by weight.

4. The method called for in claim 1 wherein the solder mask removing solution includes an organic penetrating and softening agent is chosen from a group consisting of pyrrolidones, lower molecular weight amides or glycol ethers of lower molecular weight alcohols.

5. The method called for in claim 1 including the step of agitating the solder mask removing solution.

6. The method called for in claim 1 including the step of spraying the solder mask removing solution onto the board.

7. The method called for in claim 1 wherein the step of removing the solder mask removing solution and softened permanent photoimagable solder mask comprises rinsing the board in water.

8. The method called for in claim 7 including the step of heating the water prior to rinsing the board.

9. The method called for in claim 7 including the step of agitating the water during the rinse of the board.

10. The method called for in claim 7 including the step of spraying the water on the board.

11. A method for removing an epoxy acrylic copolymer, photoimagable solder mask of a negative resist simultaneously from the insulating laminate and conductive metal traces of a printed circuit board comprising the steps of:
    (a) contacting the permanent photoimagable solder ask on the insulating laminate and conductive metal traces of a printed circuit board with solder mask removing solution containing water and an activator compound chosen from a group consisting of a hydroxide or alkali metal silicate and of a concentration greater than twelve parts per hundred by weight;
    (b) heating the solder mask removing solution to a temperature between 160 and 210 degrees Fahrenheit;
    (c) allowing the solder mask removing solution to continue contact with the permanent photoimagable solder mask for a sufficient time to soften the permanent photoimagable solder mask; and
    (d) removing the solder mask removing solution and softened permanent photoimagable solder mask simultaneously from the insulating laminate and conducive traces of the circuit board.

12. A method for removing a epoxy acrylic copolymer photoimagable solder mask of a negative resist simultaneously from the insulating laminate and conductive metal traces of a printed circuit board comprising the steps of:
    (a) contacting the permanent photoimagable solder mask on the insulating laminate and conductive traces of the printed circuit board with solder mask removing solution containing water, sodium hydroxide of a concentration between twelve and forty parts per hundred by weight, a softening agent of N-methyl pyrrolidone of 7.5 to 12 parts per hundred by weight and a corrosion inhibitor of tolyltriazole of between 0.025 and 1 part per hundred by weight;
    (b) heating the solder mask removing solution to a temperature between 160 and 210 degrees Fahrenheit;
    (c) allowing the solder mask removing solution to continue contact with the permanent photoimagable solder mask for a period of time of less than one hour to soften the permanent photoimagable solder mask; and
    (d) removing the solder mask removing solution and softened permanent photoimagable solder mask simultaneously from the insulating laminate and conducive metal traces of the circuit board.

* * * * *